United States Patent
Kim et al.

(10) Patent No.: US 7,554,371 B2
(45) Date of Patent: Jun. 30, 2009

(54) DELAY LOCKED LOOP

(75) Inventors: Jun-Bae Kim, Seoul (KR); Hyun-Ju Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 45 days.

(21) Appl. No.: 11/412,803

(22) Filed: Apr. 28, 2006

(65) Prior Publication Data

US 2007/0030042 A1  Feb. 8, 2007

(30) Foreign Application Priority Data

Aug. 2, 2005   (KR) ...................... 10-2005-0070785

(51) Int. Cl.
*H03L 7/06* (2006.01)

(52) U.S. Cl. ...................... 327/158; 327/161; 327/270; 327/271; 327/272

(58) Field of Classification Search ................ 327/149, 327/153, 158, 161, 270–272, 281; 331/176; 375/373–376
See application file for complete search history.

(56) References Cited

U.S. PATENT DOCUMENTS 6,982,579 B2 * 1/2006 Lee ............................ 327/158
2003/0067334 A1  4/2003 Brass et al.

FOREIGN PATENT DOCUMENTS

| JP | 10-074061 | 3/1998 |
|----|-----------|--------|
| JP | 2004-104747 | 4/2004 |
| JP | 2004-187245 | 7/2004 |
| KR | 10-2002-0055910 | 7/2002 |
| KR | 1020030037591 A | 5/2003 |
| KR | 10-2004-0046325 | 6/2004 |

OTHER PUBLICATIONS

Korea Office Action dated Aug. 31, 2006.
German Office Action dated Mar. 3, 2008.

* cited by examiner

*Primary Examiner*—Lincoln Donovan
*Assistant Examiner*—William Hernandez
(74) *Attorney, Agent, or Firm*—Harness, Dickey & Pierce, P.L.C.

(57) ABSTRACT

A delay locked loop for generating an internal clock signal locked to an external clock signal includes: a phase detector for detecting a phase difference between the external clock signal and the internal clock signal; a delay unit controller for generating a control signal and a selection signal in response to an output signal of the phase detector; a variable delay device (VDD), responsive to the control signal and a selection signal, to produce a delayed version of the external clock signal on a VDD output line, the variable delay device being configured such that, if the external clock signal undergoes a change from a first frequency to a second frequency significantly different than the first frequency, then a resultant load on the VDD output line nonetheless remains substantially the same.

16 Claims, 7 Drawing Sheets

DELAY LOCKED LOOP

PRIORITY STATEMENT

This application claims the benefit of Korean Patent Application No. 2005-70785, filed Aug. 2, 2005, the disclosure of which is hereby incorporated herein by reference in its entirety.

BACKGROUND OF THE INVENTION

1. Field of the Invention

The present invention relates to a semiconductor integrated circuit and, more particularly, to such a circuit that provides a delay locked loop.

2. Description of the Related Art

Generally, a synchronous dynamic random access memory (SDRAM) receives data in response to an external data input strobe signal and outputs data in response to an internal clock signal which is synchronized by an external clock signal and then generated. Thus, the SDRAM has a delay locked loop to generate an internal clock signal which is locked to the external clock signal.

The delay locked loop should be able to achieve stable operation relative to an external clock signal which has a frequency bandwidth of more than prescribed frequency (hereinafter, high frequency) and a frequency bandwidth of less than prescribed frequency (hereinafter, low frequency). That is, the delay locked loop should be able to tolerate a range of frequencies exhibited by the external clock signal, i.e., it should be able to generate the internal clock signal locked to such a range of possible frequencies of the external clock signal.

Figure 1:
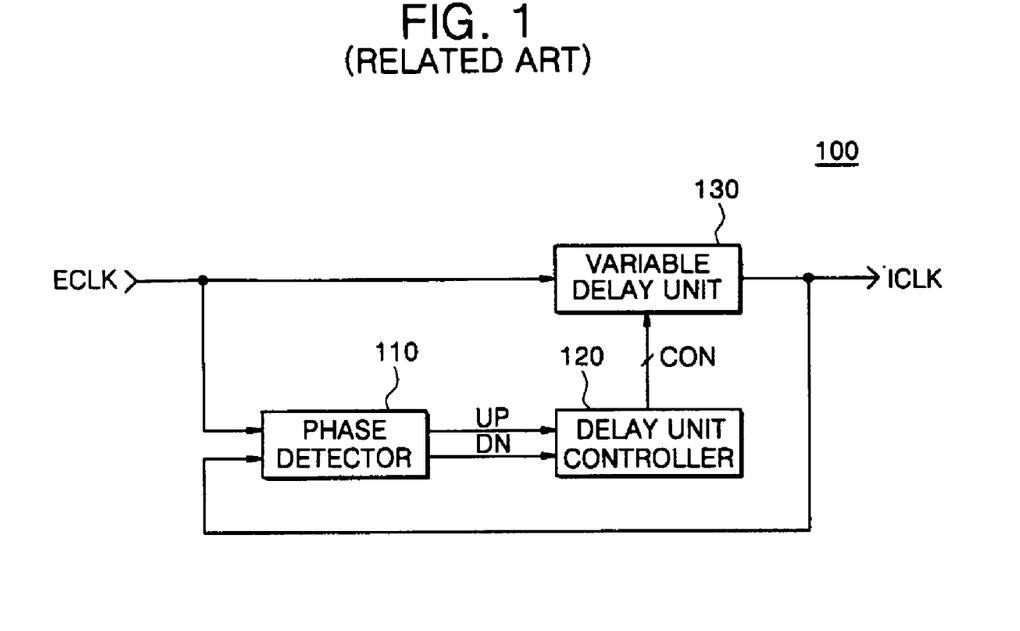
FIG. 1 is a block diagram illustrating a conventional delay locked loop 100.

FIG. 1 is a block diagram illustrating a conventional delay locked loop 100.

In FIG. 1, the delay locked loop 100 includes a phase detector 110, a delay unit controller 120, and a variable delay unit 130.

Functions of the components of FIG. 1 will be explained below.

The phase detector 110 detects a phase difference between an external clock signal ECLK and an internal clock signal ICLK, and activates an up signal UP or a down signal DN and outputs it. The delay unit controller 120 performs a counting operation to output a control signal CON in response to the up signal UP or the down signal DN outputted from the phase detector 110. The variable delay unit 130 adjusts a delay time of the external clock signal ECLK in response to the control signal CON to generate the internal clock signal ICLK. The variable delay unit 130 repetitively performs the procedure for adjusting a delay time of the external clock signal ECLK in response to the control signal CON until the internal clock signal ICLK becomes locked to the external clock signal ECLK.

Figure 2:
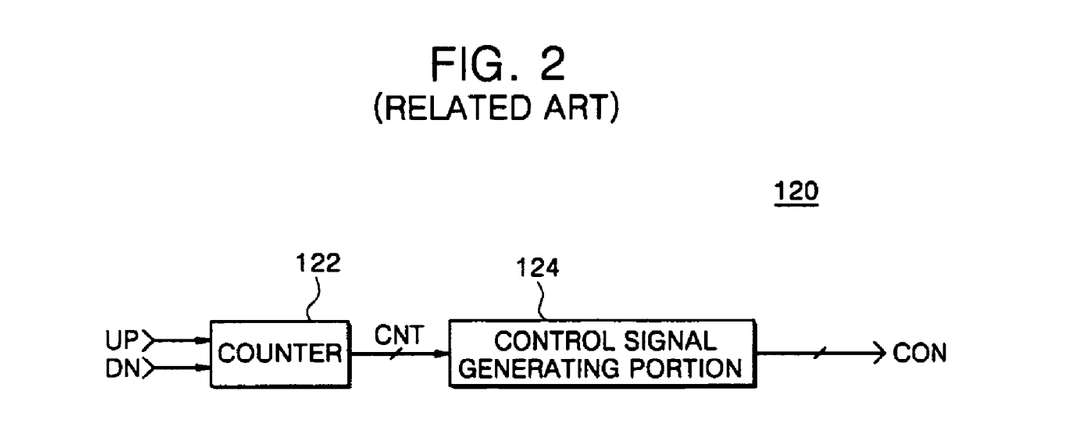
FIG. 2 is a block diagram illustrating a conventional delay unit controller of FIG. 1.

FIG. 2 is a block diagram illustrating in more detail the conventional delay unit controller 120 of FIG. 1.

The delay unit controller of FIG. 2 includes a counter 122 and a control signal generating portion 124. Functions of the components of FIG. 2 will be explained below.

The counter 122 increases the bit number of "1" of (or, in other words, increments) a counter output signal CNT when the up signal UP is generated and decreases the bit number of "1" of (or, in other words, decrements) the counter output signal CNT when the down signal DN is generated. For example, in a state that the counter output signal CNT outputted from the counter 122 is "11100000", the delay unit controller 120 performs an up counting operation to generate a counter output signal CNT of "11110000" when the up signal UP is generated, and performs a down counting operation to generate a counter output signal of "11000000" when the down signal DN is generated.

The control signal generating portion 124 generates the control signal CON in response to the counter output signal CNT. Here, the control signal CON is 8-bit data. Let us assume that the controls signal CON is 8-bit data of con1 to con8. A third upper bit con3 of the control signal becomes "1" when the counter output signal CNT is "11100000", and a fifth upper bit con5 of the control signal CON becomes "1" when the counter output signal CNT is "11111000". That is, one bit data of the control signal CON in response to the counter output signal CNT becomes "1".

Figure 3:
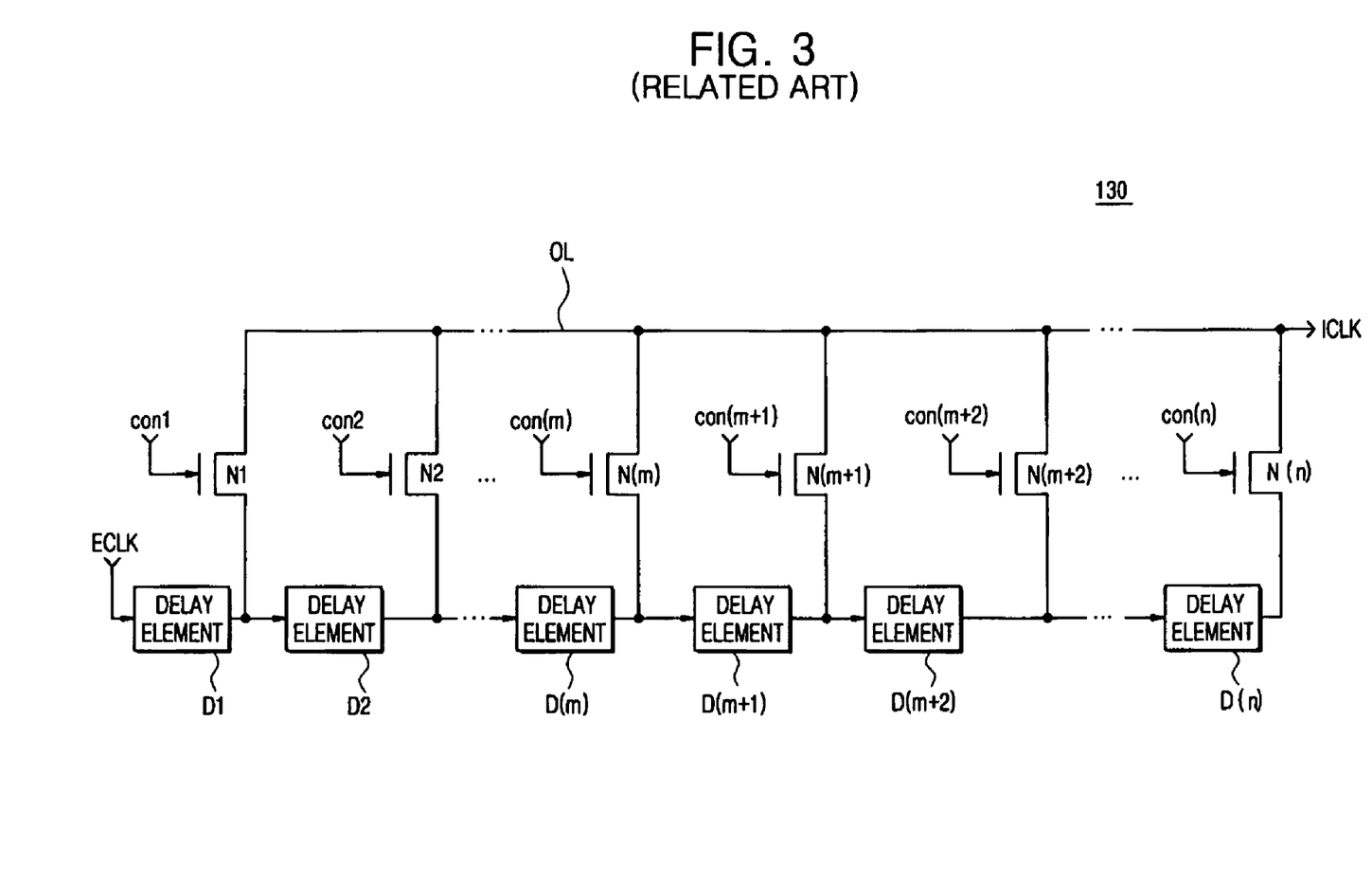
FIG. 3 is a block diagram illustrating a variable conventional delay unit 130 of FIG. 1.

FIG. 3 is a block diagram illustrating the conventional variable delay unit 130 of FIG. 1.

The variable delay unit 130 of FIG. 3 includes n delay elements D1 to D(n) and n switch transistors N1 to N(n). In FIG. 3, "OL" denotes an output line for outputting the internal clock signal ICLK, and n-bit data con1 to con(n) represents the control signal CON of FIG. 2.

Referring to FIG. 3, the n delay elements D1 to D(n) are cascade-connected to each other, and the n switch transistors N1 to N(n) are connected between an output of the n delay elements D1 to D(n) and the output line OL.

Functions of the components of FIG. 3 will be explained below.

Each of the n delay elements D1 to D(n) receives the external clock signal ECLK and delays it by a prescribed time. If the delay time of each of the delay elements D1 to D(n) is "Td", the n-th delay element D(n) delays the external clock signal by n×Td, and the m-th delay element D(m) delays the external clock signal by m×Td. Each of the n switch transistors N1 to N(n) is turned on or off in response to the n-bit data con1 to con(n) to transmit an output signal of a selected one among the n delay elements D1 to D(n) to the output line OL. Here, the output signal transmitted to the output line OL is the internal clock signal CLK.

The variable delay unit 130 of FIG. 3 is designed to include a large number of delay elements so as to tolerate both the external clock signal ECLK of the high frequency and the external clock signal ECLK of the low frequency. Thus, since a large number of delay elements and switch transistors are connected to the output line OL, the output line OL has the heavy load.

When the external clock signal ECLK of the high frequency is applied, a smaller number of delay elements are used compared to when the external clock signal ECLK of the low frequency is applied. The load of the output line OL is the same regardless of the frequency of the external clock signal ECLK. Thus, the load of the output line OL is affected even by the switch transistors and the delay elements which are not used when the external clock signal ECLK of the high frequency is applied.

For example, the m delay elements D1 to D(m) are used when the external clock signal ECLK of the high frequency is applied, whereas all of the n delay elements D1 to D(n) are used when the external clock signal ECLK of the low frequency is applied. Here, m is a natural number which is greater than "1" and less than "n". Thus, when the external clock signal ECLK of the high frequency is applied, the (n-m) switch transistors N(m+1) to N(n) and the (n-m) delay elements D(m+1) to D(n) which do not operate serve as the load of the output line OL.

The line load is increased because the length of the output line OL is enlarged by the (n-m) delay elements (m+1) to D(n) which are for low frequency operation, and the junction load is increased by the (n-m) switch transistors N(m+1) to N(n) which are for low frequency operation. Meanwhile, the size of a driver which generates a clock signal to an output of the delay element should be increased to stably supply the internal clock signal ICLK when the external clock signal ECLK of the high frequency is applied. It may cause high power consumption as well as increment of the chip size.

Figure 4:
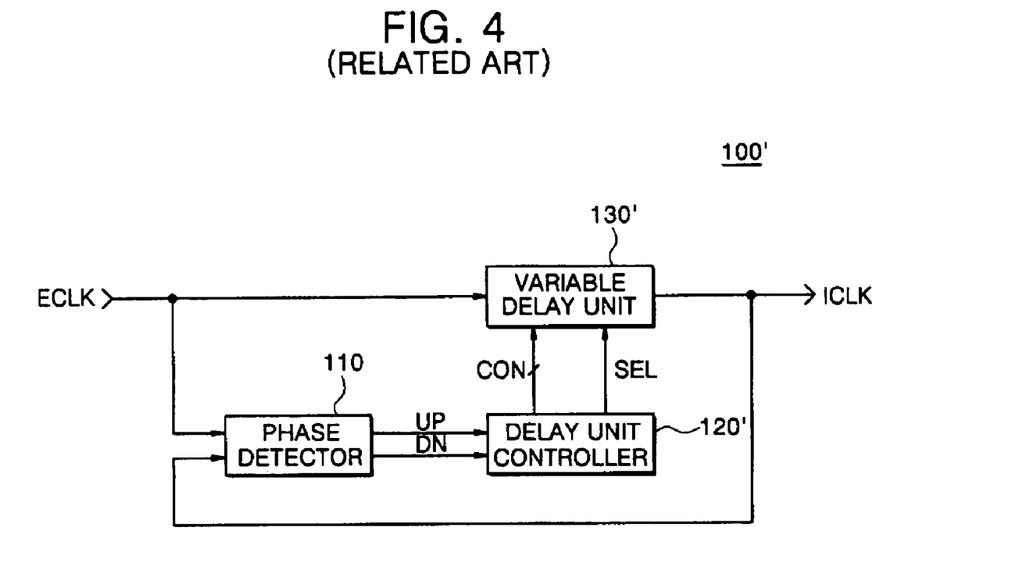
FIG. 4 is a block diagram illustrating another conventional delay locked loop.

FIG. 4 is a block diagram illustrating another conventional delay locked loop 100'. In FIG. 4, the delay locked loop 100' includes a phase detector 110, a delay unit controller 120', and a variable delay unit 130'. A function of the phase detector 110 is similar to that of FIG. 1. The delay unit controller 120' generates a control signal CON by the same method as the delay unit controller 120 of FIG. 1 and generates a selection signal SEL in response to the counter output signal CNT. The variable delay unit 130' delays the external clock signal ECLK in response to the control signal CON and the selection signal SEL to generate the internal clock signal ICLK locked to the external clock signal ECLK.

Figure 5:
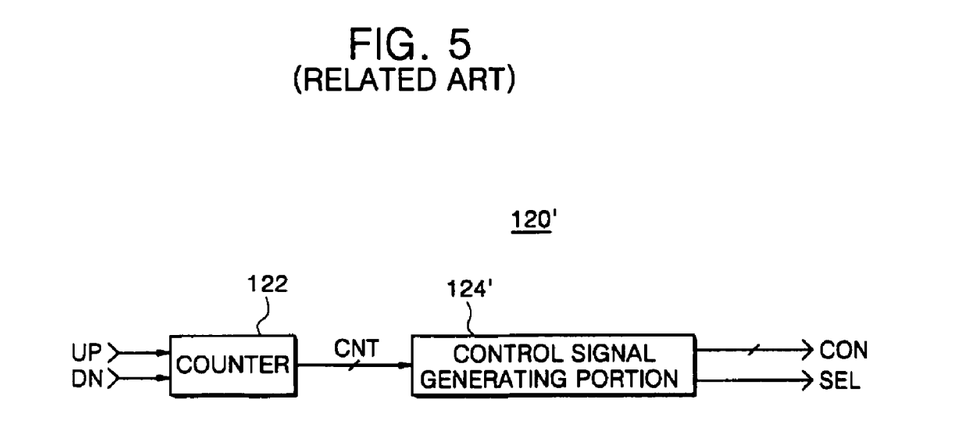
FIG. 5 is a block diagram illustrating a conventional delay unit controller of FIG. 4.

FIG. 5 is a block diagram illustrating the conventional delay unit controller 120' of FIG. 4.

In FIG. 5, the delay unit controller 120' of FIG. 5 includes a counter 122 and a control signal generating portion 124'. The counter 122 of FIG. 5 is similar in function to that of FIG. 2, and the control signal generating portion 124' generates the control signal CON by the same method as the control signal generating portion 124 of FIG. 2. The control signal generating portion 124' generates the selection signal SEL in response to the counter output signal CNT. If the counter output signal CNT comprises n-bit data in which first to m-th bits are used as control signals for both the high frequency and the low frequency and (m+1)-th to n-th bits are used as the control signals only for the low frequency, the selection signal SEL becomes "1" when all of first to m-th bits are "1", whereas it becomes "0" when all of (m+1)-th to n-th bits are "1".

Figure 6:
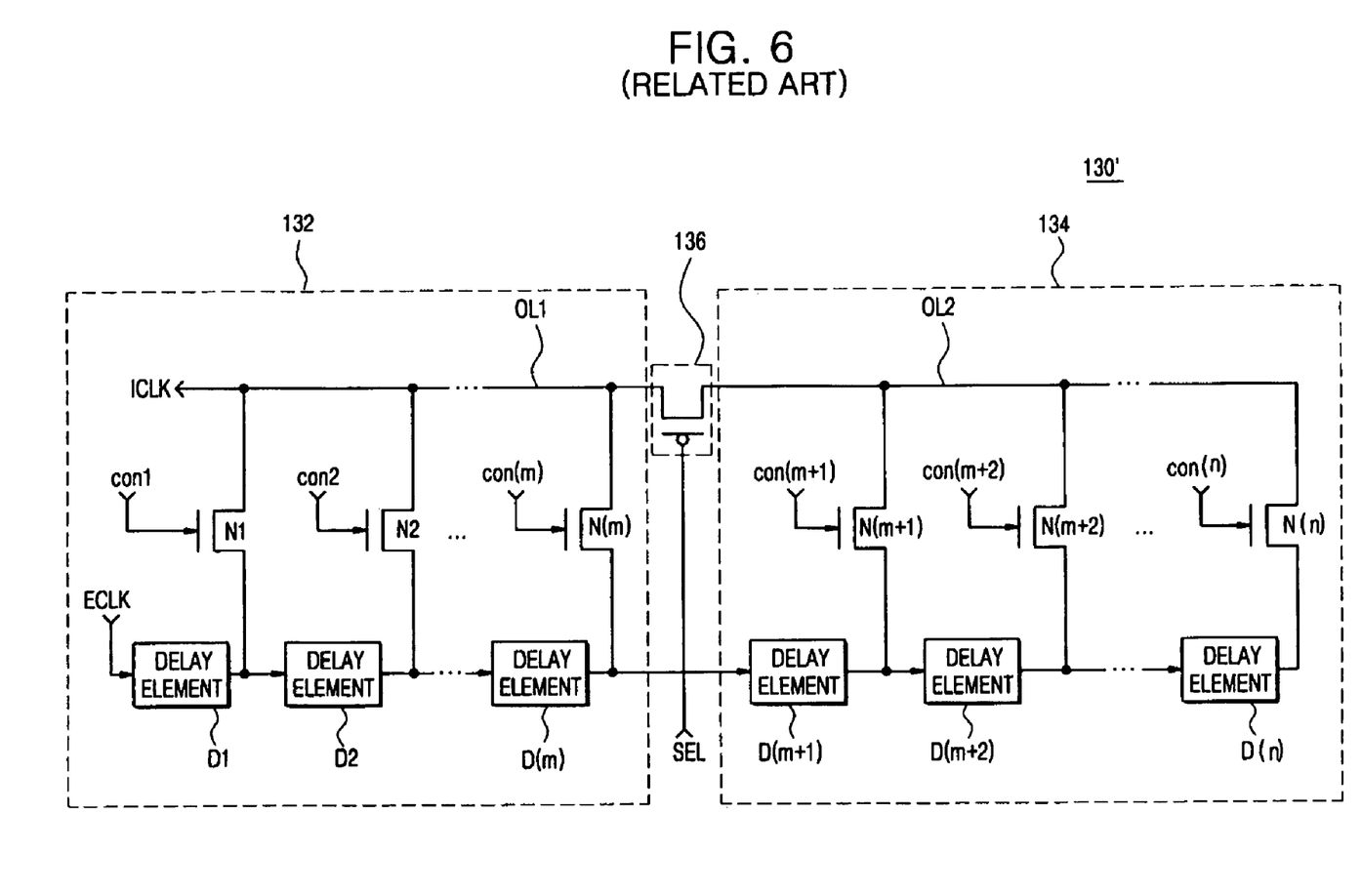
FIG. 6 is a block diagram illustrating a conventional variable delay unit of FIG. 4.

FIG. 6 is a block diagram illustrating the conventional variable delay unit 130' of FIG. 4.

In FIG. 6, the variable delay unit 130' includes a first variable delay block 132, a second variable delay block 134, and a switch 136. The first variable delay block 132 includes a first group of delay elements D1 to D(m) and a first group of switch transistors N1 to N(m), and the second variable delay block 134 includes a second group of delay elements D(m+1) to D(n) and a second group of switch transistors N(m+1) to N(n). The switch transistors N1 to N(n) are NMOS transistors, and the switch 136 is a PMOS transistor. OL1 and OL2 represent first and second output lines, respectively.

Functions of the components of FIG. 6 will be explained below.

The delay elements D1 to D(n) and the switch transistors N1 to N(m) are similar in function to those of FIG. 3 except for the following. In case where the external clock signal ECLK of the high frequency is applied, when at least one bit data among the first to m-th bit data of the counter output signal CNT is "1", one bit signal among the control signals con1 to con(m) becomes "1" and the selection signal SEL becomes "1", so that the switch 136 is turned off. As a result, the first output line OL1 and the second output line OL2 become disconnected from each other, whereby the internal clock signal ICLK is generated through the first output line OL1 and the load of the first output line OL1 is decreased. On the other hand, in case where the external clock signal ECLK of the low frequency is applied, when at least one bit data among the first to m-th bit data of the counter output signal CNT is "1", one signal among the control signals con1 to con(m) becomes '1" and the selection signal SEL becomes "1", so that the switch 136 is turned off. When at least one bit data among the (m+1)-th to n-th bit data is "1", one signal among the control signals con(m+1) to con(n) becomes '1" and the selection signal SEL becomes "0", so that the switch 136 is turned on. Thus, when the external clock signal ECLK of the low frequency is applied, the switch 136 is first turned off, so that the first and second output lines OL1 and OL2 become disconnected, and in this state the internal clock signal ICLK is generated through the first output line OL1. Here, when the internal clock signal ICLK and the external clock signal ECLK are not locked to each other, the switch 136 is turned on, so that the first and second output lines OL1 and OL2 become connected together, and thus the internal clock signal ICLK is generated through the first and second output lines OL1 and OL2. That is, when the external clock signal ECLK has the low frequency, the variable delay unit 130' may have the suddenly increased load of the output line while performing its operation in a state that the load of the output line is decreased.

The variable delay unit 130' of FIG. 6 has an effect in that the load of the output line is decreased when the external clock signal ECLK has the high frequency. However, when the external clock signal ECLK has the low frequency, the load of the output line is instantly increased when the switch 136 is turned on in response to the selection signal SEL. Thus, a gradient of the internal clock signal ICLK instantly fluctuates, so that a jitter occurs in the internal clock signal ICLK, and it has bad effects on a data window.

Further, when the internal clock signal ICLK locked to the external clock signal ECLK is generated in turn through either of the first and second output lines OL1 and OL2 due to variation in process, voltage and temperature (PVT), the load of the output line often varies. It results in unstable operation of the delay locked loop.

SUMMARY

An embodiment of the present invention provides a delay locked loop in which the load of the output line of the variable delay unit is decreased and is maintained substantially constantly during higher and lower frequency operation relative to a reference frequency.

An embodiment of the present invention provides a delay locked loop in which stable operation is achieved by separating an output line for such high frequency operation and an output line for such low frequency operation.

An embodiment of the invention provides a delay locked loop (DLL) for generating an internal clock signal locked to an external clock signal. Such a DLL can include: a phase detector for detecting a phase difference between the external clock signal and the internal clock signal; a delay unit controller for generating a control signal and a selection signal in response to an output signal of the phase detector; at least two variable delay units, which are cascade-connected to each other, to delay the external clock signal and output the delayed external clock signal to at least two respective output lines which are separated from each other in response to the control signal; and selecting means for selecting a signal on one of the at least two output lines and for providing the selected signal as the internal clock signal in response to the selection signal.

Another embodiment of the invention provides a delay locked loop (again, DLL). Such a DLL can include: a phase detector for detecting a phase difference between an external clock signal and an internal clock signal; a delay unit control to generate a plural-bit control signal and a selection signal in response to an output signal of the phase detector; and a variable delay device to delay the external clock signal and to generate the internal clock signal locked to the external clock signal, in response to the plural-bit control signal, the variable delay device including the following, first and second variable delay units which are cascade-connected to each other, each of the first and second variable delay units including a plurality of delay elements which are cascade-connected to each other to delay the external clock signal; first and second switch means for transmitting a signal outputted from the first variable delay unit to a first output line in response to upper-bit data of the plural-bit control signal and for transmitting a signal outputted from the second variable delay unit to a second output line separate from the first output line in response to lower-bit data of the plural-bit control signal; and selecting means for selecting a signal outputted from the first or second output line as the internal clock signal, in response to the selection signal.

Another embodiment of the present invention provides a delay locked loop (again DLL). Such a DLL can include: a phase detector for detecting a phase difference between the external clock signal and the internal clock signal; a delay unit controller for generating a control signal and a selection signal in response to an output signal of the phase detector; a variable delay device (VDD), responsive to the control signal and a selection signal, to produce a delayed version of the external clock signal on a VDD output line, the variable delay device being configured such that, if the external clock signal undergoes a change from a first frequency to a second frequency significantly different than the first frequency, then a resultant load on the VDD output line nonetheless remains substantially the same.

Additional features and advantages of the present invention will be more fully apparent from the following detailed description of example embodiments, the accompanying drawings and the associated claims.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted.

The above and other features and advantages of the present invention will become more apparent to those of ordinary skill in the art by describing in detail preferred embodiments thereof with reference to the attached drawings in which.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

The present invention will now be described more fully hereinafter with reference to the accompanying drawings, in which example embodiments of the present invention are shown. The present invention may, however, be embodied in different forms and should not be construed as limited to the example embodiments set forth herein. Rather, these example embodiments are provided so that this disclosure will be thorough and complete, and will fully convey the scope of the present invention to those skilled in the art. Like numbers refer to like elements throughout the specification.

Figure 9:
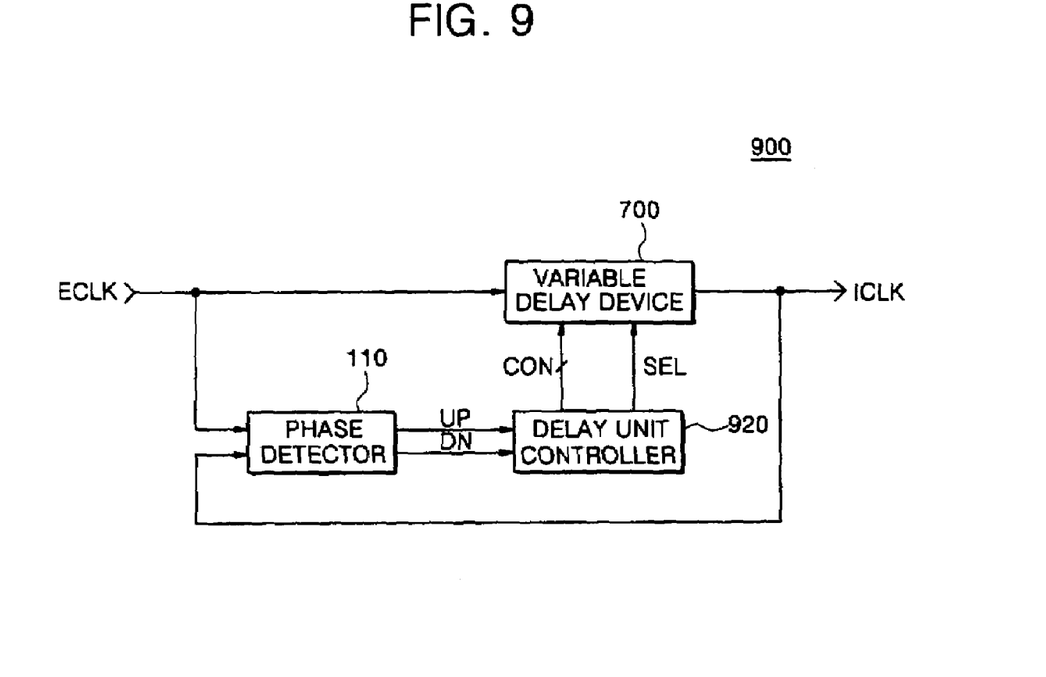
FIG. 9 is a block diagram illustrating a delay locked loop according to an example embodiment of the present invention.

FIG. 9 is a block diagram illustrating a delay locked loop 900 according to an embodiment of the present invention.

In FIG. 9, the delay locked loop 900 includes: a phase detector 110; a delay unit controller 920; and a variable delay device 700. The delay unit controller 920 can be similar to or the same as the conventional delay unit controller 120.

Figure 10:
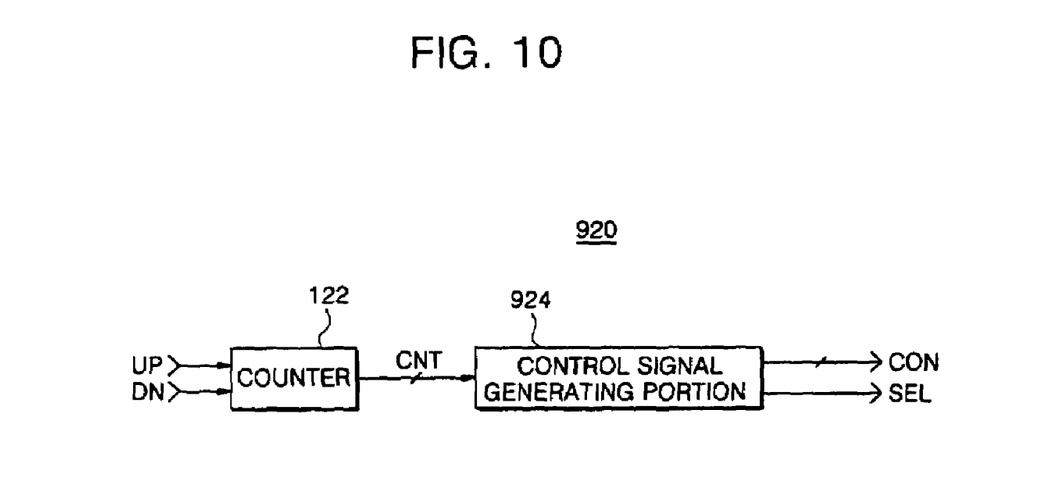
FIG. 10 is a block diagram illustrating in more detail (according to an example embodiment of the present invention) the delay unit controller of FIG. 9.

FIG. 10 is a block diagram illustrating in more detail (according to an example embodiment of the present application) the delay unit controller 920 in more detail.

In FIG. 10, the delay unit controller 920 includes the counter 122 and a control signal generating portion 924. The latter, namely the control signal generating portion 924 can be similar to or the same as the conventional control signal generating portion 124'.

Figure 7:
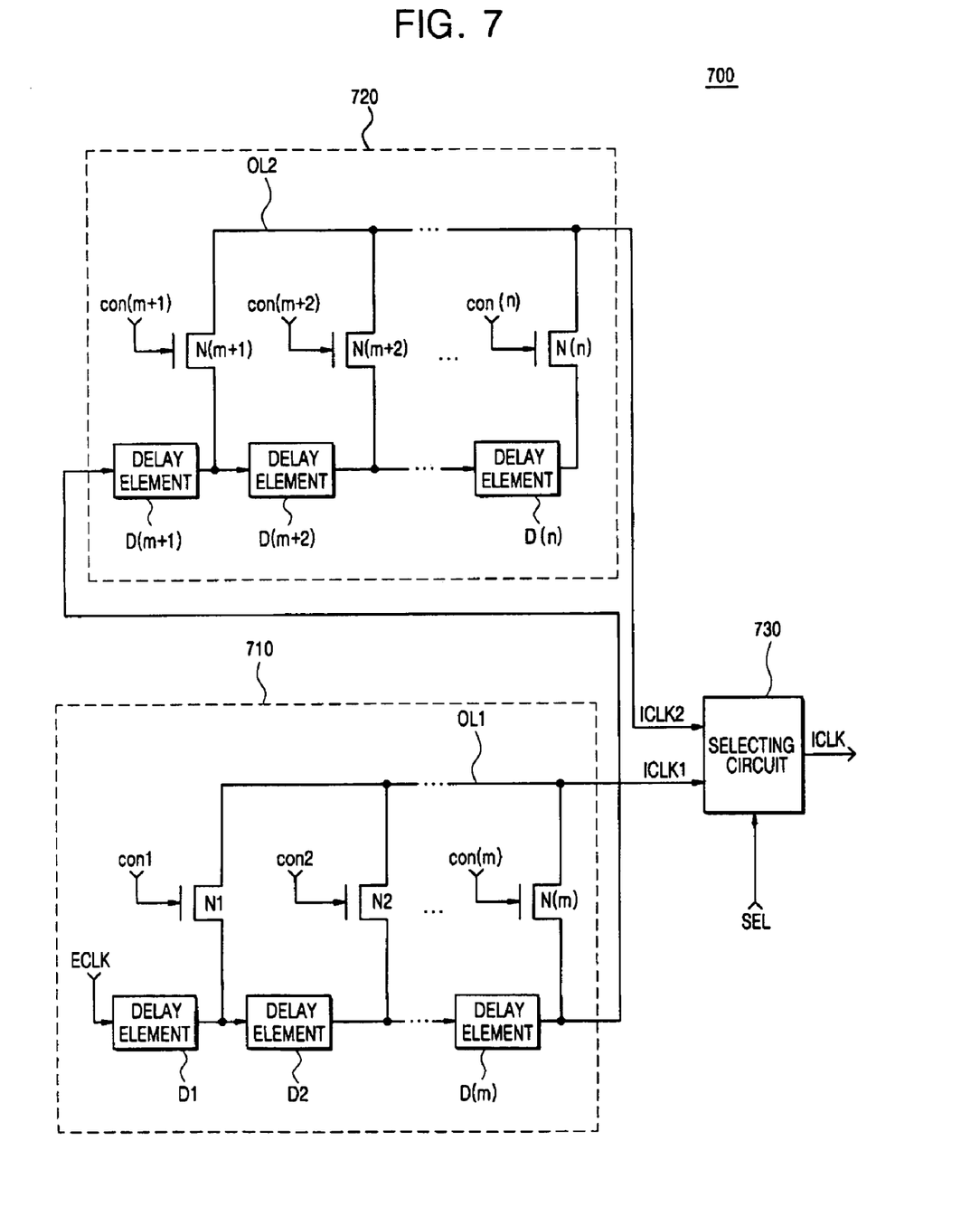
FIG. 7 is a block diagram illustrating in more detail (according to an example embodiment of the present invention) the variable delay unit of the delay locked loop of FIG. 9.

FIG. 7 is a block diagram illustrating in more detail (according to an embodiment of the present invention) the variable delay device 700 of the delay locked loop 900.

In FIG. 7, the variable delay device 700 of FIG. 7 includes a first variable delay unit 710, a second variable delay unit 720, and a selecting circuit 730. The first variable delay unit 710 includes a first group of delay elements D1 to D(m) and a first group of switch transistors N1 to N(m), and the second variable delay unit 720 includes a second group of delay elements D(m+1) to D(n) and a second group of switch transistors N(m+1) to N(n).

The variable delay device 700 of FIG. 7 is configured, relative to the conventional variable delay unit 130' of FIG. 6, such that the switch 136 has been removed, the first output line OL1 for the high frequency and the second output line OL2 for the low frequency have been separated, and the selecting circuit 730 has been added.

The delay locked loop 900 via the variable delay device 700 outputs the locked internal clock signal ICLK1 through the first output line OL1 of the first variable delay unit 710 when the external clock signal ECLK has the high and low frequencies, and outputs the locked internal clock signal ICLK2 through the second output line OL2 of the second variable delay unit 720 when the external clock signal ECLK has the low frequency. As a result, the load of the output line is substantially constantly maintained regardless of whether the external clock signal ECLK has the high frequency or the low frequency.

Operation of the variable delay unit 700 of the present invention will be explained below.

For example, the control signal CON and the selection signal SEL which are applied to the variable delay device 700 can be generated by the same method as FIG. 5.

The delay elements D1 to D(m) of the first variable delay unit 710 delay the external clock signal ECLK by a prescribed time period when the external clock signal ECLK has the high frequency or the low frequency, and the delay elements D(m+1) to D(n) of the second variable delay unit 720 delay the external clock signal ECLK together with the delay elements D1 to D(m) of the first variable delay unit 710 when the external clock signal ECLK has the low frequency. The switch transistors N1 to N(n) output the external clock signal ECLK delayed by the delay elements D1 to D(m) of the first variable delay unit 710 to the first output line OL1 and output the external clock signal ECLK delayed by the delay elements D(m+1) to D(n) of the second variable delay unit 720 to the second output line OL2 respectively in response to the control signal CON of n bits con1 to con(n). For example, in the case where the external clock signal ECLK has the high frequency, when the control signal CON comprising n bits becomes "0010 . . . 0" by repetitive up counting operation, the control signal con3 becomes "1", and so the third transistor N3 among the n switch transistors N1 to N(n) is turned on to transmit an output signal of the delay element D3 to the first output line OL1 as the internal clock signal. At this time, the first output line OL1 is not affected by the load of the second output line OL2 and the load caused by the switch transistors N(m+1) to N(n) and the delay elements D(m+1) to D(n) of the second group. The selecting unit 730 selects the internal clock signal ICLK1 in response to the selection signal SEL and generates it as the internal clock signal ICLK.

That is, when the external clock signal has the high frequency, the signal generated by the delay elements D1 to D(m) of the first variable delay unit 710 is outputted as the internal clock signal ICLK.

On the other hand, in case where the external clock signal ECLK has the low frequency, when the control signal con(m) of "1" is generated by the repetitive up counting operation, the output signal of the m-th delay element D(m) is transmitted to the first output line OL1 through the m-th switch transistor N(m), which is then outputted as the internal clock signal ICLK1. The selecting circuit 730 selects the internal clock signal ICLK1 in response to the selection signal SEL and generates it as the internal clock signal ICLK. The internal clock signal ICLK and the external clock signal ELCK are not locked to each other, and thus when the control signal con (m+1) of "1" is generated, the output signal of the (m+1)th delay element D(m+1) is transmitted to the second output line OL2 through the (m+1)th switch transistor N(m+1). The output signal of the (m+1)-th delay element D(m+1) transmitted to the second output line OL2 is the internal clock signal ICLK2. The selecting circuit 730 selects the internal clock signal ICLK2 in response to the selection signal SEL and generates it as the internal clock signal ICLK locked to the external clock signal ECLK. Accordingly, in case where the external clock signal ECLK has the low frequency, since the load of the first output line OL1 of when one of the switch transistors N1 to N(m) of the first group is turned on is the same as the load of the second output line OL2 of when one of the switch transistors N(m+1) to N(n) of the second group, the stable internal clock signal ICLK is generated.

That is, when the external clock signal ECLK has the low frequency, the signal outputted through the delay elements D1 to D(m) of the first group is outputted to the first output line OL1, and the signal outputted through the delay elements D(m+1) to D(n) of the second group is outputted to the second output line OL2, and thus the load of the output line is not increased.

On the other hand, in case where the delay unit controller 920 of the delay locked loop 900 includes (as in FIG. 10) the counter 122 and a control signal generating portion 924 and a counter output signal is n-bit data having initial values of "1", the counter generates the internal clock signal ICLK locked to the external clock signal ECLK while performing down counting operation. In this case, the (n−1)th control signal con(n−1) is activated after the n-th control signal con(n) is activated, and the (n−2)th control signal con(n−2) is activated after the (n−1)th control signal con(n−1) is activated. For example, the selection signal SEL can be generated by the same method as FIG. 5 described above. In the case where the external clock signal ECLK has the high frequency, the load of the output line is not increased by outputting the signal outputted through the delay elements D(m+1) to D(n) of the second variable delay unit 720 to the second output line OL2 and outputting the signal outputted through the delay elements D1 to D(m) of the first variable delay unit 710 to the first output line OL1. During the high frequency operation, the clock signal ICLK1 generated through the first output line OL1 is generated as the internal clock signal ICLK clocked to the external clock signal ECLK, whereas during the low frequency operation, the clock signal ICLK2 generated through the first output line OL2 is generated as the internal clock signal ICLK clocked to the external clock signal ECLK.

To facilitate a simpler arrangement, the first and second output lines OL1 and OL2 should be substantially the same length. For example, when n is an even number, m is n/2, and when n is an odd number, m is a number obtained by rounding off n/2 or a number obtained by excluding the remainder from n/2. For example, if n is 32, then m is 16, and if n is 33, then m is 17 or 16. Alternatively, differing lengths for the first and second output lines OL1 and OL2 are contemplated.

Figure 8:
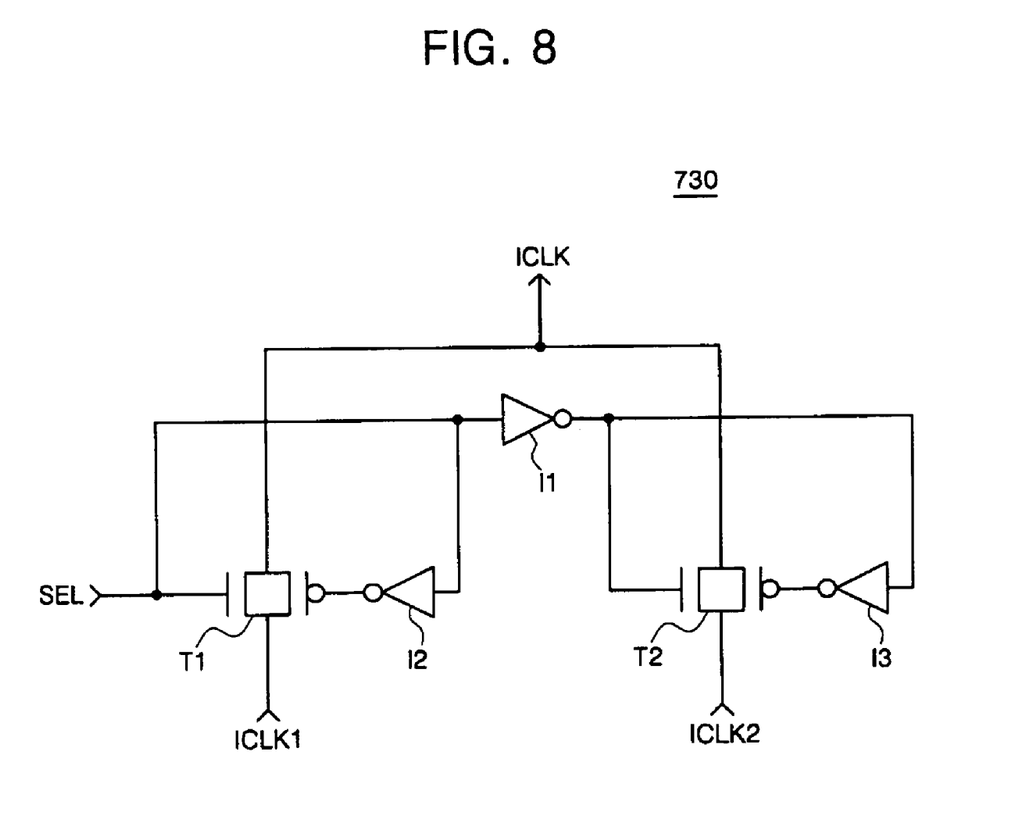
FIG. 8 is a circuit diagram illustrating in more detail (according to an example embodiment of the present invention) the selecting circuit of FIG. 7.

FIG. 8 is a circuit diagram illustrating in more detail (according to an example embodiment of the present invention) the selecting circuit 730 of FIG. 7.

In FIG. 8, the selecting circuit 730 includes CMOS transmission gates T1 and T2 and inverters I1 to I3. Operation of the selecting circuit 730 of FIG. 8 will be explained below. When the selection signal SEL of "1" is applied, the CMOS transmission gate T1 is turned on to select the internal clock signal ICLK1 and generates it as the internal clock signal ICLK. When the selection signal SEL of "0" is applied, the CMOS transmission gate T2 is turned on to select the internal clock signal ICLK2 and generates it as the internal clock signal ICLK.

The selection signal SEL is "1" until the first to m-th bits become "1" and is "0" until the (m+1i)-th to n-th bits becomes "1" as described above.

A delay locked loop 900 that incorporates the variable delay device 700 does not undergo a phenomenon that the load of the output line is instantly increased when operation mode changes from a relatively higher frequency to a relatively lower frequency as well as when the operation mode changes from the relatively lower frequency to the relatively higher frequency since the first output line OL1 for the high frequency and the second output line OL2 for the low frequency are substantially completely separated from each other. Accordingly, such a delay locked loop outputs the internal clock signal ICLK locked to the external clock signal ECLK while operating stably in all frequency bands.

The variable delay device 700 described above includes the two groups of delay elements, the two groups of switch transistors, the two separated output lines, and the two-input selecting circuit for the high frequency operation and the low frequency operation. However, alternatively, other arrangements are contemplated. For example, the variable delay device 700 can be varied to include three groups of delay elements, three groups of switch transistors, three separated output lines, and a three-input selecting circuit for the high frequency operation, an intermediate frequency operation, and the low frequency operation. Such a three-input selecting circuit generates the selection signal of 2 bits or 3 bits.

As described above, a delay locked loop according to one or more embodiments of the present invention performs stable operation by substantially completely separating the output line of the variable delay device into the output line for the high frequency and the output line for the low frequency so that the load of the output line is decreased and is constantly controlled.

As a result, even though the internal clock signal ICLK locked to the external clock signal ECLK is generated in turn through different output lines due to variation in process, voltage and temperature (PVT), the load of the output line is constantly maintained, leading to the stable operation.

With some embodiments of the present invention having thus been described, it will be obvious that the same may be varied in many ways. Such variations are not to be regarded as a departure from the spirit and scope of the present invention, and all such modifications are intended to be included within the scope of the present invention.

What is claimed:

1. A delay locked loop for generating an internal clock signal locked to an external clock signal, the delay locked loop comprising:
    a phase detector for detecting a phase difference between the external clock signal and the internal clock signal;
    a delay unit controller for generating a control signal and a selection signal in response to an output signal of the phase detector;
    at least two variable delay units, which are cascade-connected to each other, to delay the external clock signal and output the delayed external clock signal to at least two respective output lines which are separated from each other in response to the control signal; and
    a selecting circuit for receiving at least three inputs, the at least three inputs including the selection signal and the at least two output lines, wherein the selecting circuit selects a signal on one of the at least two output lines, and provides the selected signal as the internal clock signal in response to the selection signal,
    wherein the selecting circuit includes,
        a first transmission gate receiving a clock signal via one of the at least two output lines and outputting the received clock signal as the internal clock signal in response to activation of the selection signal, and
        a second transmission gate receiving another clock signal via another of the at least two output lines and outputting the received another clock signal as the internal clock signal in response to inactivation of the selection signal.

2. The delay locked loop of claim 1, wherein the phase detector compares a phase difference between the external clock signal and the internal clock signal to generate an up or down signal.

3. The delay locked loop of claim 2, wherein the delay unit controller includes:
    a counter to perform an up counting operation in response to the up signal and a down counting operation in response to the down signal to thereby generate a plural-bit counter output signal; and
    a control signal generator to activate one among the plural bits of the plural-bit control signal in response to the plural-bit counter output signal, and to produce the selection signal in response to the activated bit of the delay signal.

4. The delay locked loop of claim 1, wherein the at least two output lines are substantially the same in length.

5. The delay locked loop of claim 4, wherein each of the at least two variable delay units includes:
    a plurality of delay elements which are cascade-connected to each other; and
    a plurality of switches for transmitting to a corresponding output line a signal outputted from one of the plurality of delay elements in response to the control signal.

6. The delay locked loop of claim 5, wherein each of the plurality of switches includes an NMOS transistor.

7. A delay locked loop comprising:
    a phase detector for detecting a phase difference between an external clock signal and an internal clock signal;
    a delay unit control to generate a plural-bit control signal and a selection signal in response to an output signal of the phase detector; and
    a variable delay device to delay the external clock signal and to generate the internal clock signal locked to the external clock signal, in response to the plural-bit control signal, the variable delay device including the following, first and second variable delay units which are cascade-connected to each other, each of the first and second variable delay units including a plurality of delay elements which are cascade-connected to each other to delay the external clock signal;

first and second switches for transmitting a signal outputted from the first variable delay unit to a first output line in response to upper-bit data of the plural-bit control signal and for transmitting a signal outputted from the second variable delay unit to a second output line separate from the first output line in response to lower-bit data of the plural-bit control signal; and a selecting circuit for receiving at least three inputs, the at least three inputs including the selection signal and the at least two output lines, wherein the selecting circuit selects a signal outputted from the first or second output line as the internal clock signal, in response to the selection signal, wherein the selecting circuit includes, a first transmission gate for generating a signal outputted from the first switch as the internal clock signal in response to activation of the selection signal, and a second transmission gate for generating a signal outputted from the second switch as the internal clock signal in response to inactivation of the selection signal.

8. The delay locked loop of claim 7, wherein the phase detector compares a phase difference between the external clock signal and the internal clock signal to generate an up or down signal.

9. The delay locked loop of claim 7, wherein the first and second output lines are substantially the same in length.

10. The delay locked loop of claim 7, wherein the delay unit controller includes:

a counter to perform an up counting operation in response to the up signal and a down counting operation in response to the down signal to thereby generate a plural-bit counter output signal; and a control signal generator to activate one among the plural bits of the plural-bit control signal, and to activate the selection signal in response to the upper-bit data of the plural-bit counter output signal, and to inactivate the selection signal in response to the lower-bit data of the plural-bit counter output signal.

11. The delay locked loop of claim 10, wherein the first variable delay unit includes a subset among the plurality of delay elements which are cascade-connected to each other; and the second variable delay unit includes the remaining delay elements among the plurality of delay elements which are cascade-connected to each other.

12. The delay locked loop of claim 11, wherein the first switch includes a plurality of first switches which respectively transmit to the first output line output signals of the subset of delay elements in response to the upper bits of the plural-bit control signal, and the second switch includes a plurality of second switches which respectively transmit to the second output line output signals of the remaining delay elements in response to the lower bits of the plural-bit control signal.

13. The delay locked loop of claim 12, wherein the first and second switches include an NMOS transistor.

14. A delay locked loop (DLL) for generating an internal clock signal locked to an external clock signal, the DLL comprising:

a phase detector for detecting a phase difference between the external clock signal and the internal clock signal;

a delay unit controller for generating a control signal and a selection signal in response to an output signal of the phase detector;

a variable delay device (VDD), responsive to the control signal and a selection signal, to produce a delayed version of the external clock signal on a VDD output line, the variable delay device being configured such that when the external clock signal undergoes a change from a first frequency to a second frequency significantly different than the first frequency, an external device connected to the internal clock signal experiences a constantly maintained resultant load created by the VDD output lines; and a selecting circuit including, a first transmission gate receiving a clock signal from the variable delay device and outputting the received clock signal as the internal clock signal in response to activation of the selection signal; and a second transmission gate receiving another clock signal from the variable delay device and outputting the received another clock signal as the internal clock signal in response to inactivation of the selection signal.

15. The DLL of claim 14, wherein the variable delay device includes:

at least two variable delay units (VDUs), which are cascade-connected to each other and which are responsive to the control signal, to delay the external clock signal and provide the delayed external clock signal onto one of at least two respective VDU output lines which are separated from each other, loads on the respective VDU output lines being substantially the same, wherein the selecting circuit, responsive to the selection signal, selects a delayed version of the external clock signal present on one of the at least two VDU output lines and provides the selected signal onto the VDD output line.

16. The DLL of claim 15, wherein each of the at least two variable delay units includes:

a plurality of delay elements which are cascade-connected to each other; and a plurality of switches to provide onto a corresponding VDU output line a signal outputted from one of the plurality of delay elements in response to the control signal.

* * * * *